(12) United States Patent
Laprade et al.

(10) Patent No.: US 7,870,458 B2
(45) Date of Patent: Jan. 11, 2011

(54) PARALLEL ARRANGEMENT OF SERIAL CONCATENATED CONVOLUTIONAL CODE DECODERS WITH OPTIMIZED ORGANIZATION OF DATA FOR EFFICIENT USE OF MEMORY RESOURCES

(75) Inventors: Maria Laprade, Palm Bay, FL (US); Matthew C. Cobb, W. Melbourne, FL (US); Timothy F. Dyson, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 916 days.

(21) Appl. No.: 11/685,849

(22) Filed: Mar. 14, 2007

(65) Prior Publication Data

US 2008/0229170 A1    Sep. 18, 2008

(51) Int. Cl.
*H03M 13/00* (2006.01)
(52) U.S. Cl. .................. 714/752; 714/758; 714/755
(58) Field of Classification Search .................. 714/752, 714/755, 758
See application file for complete search history.

(56) References Cited

U.S. PATENT DOCUMENTS

| | | | |
|---|---|---|---|
| 6,029,264 A | 2/2000 | Kobayashi et al. | |
| 6,202,189 B1 | 3/2001 | Hinedi et al. | |
| 6,263,466 B1 | 7/2001 | Hinedi et al. | |
| 6,323,788 B1 | 11/2001 | Kim et al. | |
| 6,775,800 B2 | 8/2004 | Edmonston et al. | |
| 6,789,218 B1 | 9/2004 | Edmonston et al. | |
| 6,983,412 B2 | 1/2006 | Fukumasa | |
| 7,093,179 B2 | 8/2006 | Shea | |
| 7,200,798 B2 | 4/2007 | Bickerstaff | |
| 7,302,621 B2 | 11/2007 | Edmonston et al. | |
| 7,673,213 B2 | 3/2010 | Chugg et al. | |
| 7,770,087 B2 | 8/2010 | Laprade et al. | |
| 2002/0029364 A1* | 3/2002 | Edmonston et al. | ......... 714/755 |
| 2005/0229087 A1 | 10/2005 | Kim et al. | |

OTHER PUBLICATIONS

U.S. Appl. No. 11/931,156, filed Oct. 2007, Laprade et al.
U.S. Appl. No. 11/685,919, filed Mar. 2007, Laprade et al.
U.S. Appl. No. 11/744,440, filed May 2007, Laprade et al.
Benedetto, et al., "A Soft-Input Soft-Output APP Module for Iterative Decoding of Concatenated Codes," IEEE Comm. Letters, vol. 1, No. 1, Jan. 1997 pp. 22-24.

(Continued)

*Primary Examiner*—Sam Rizk
(74) *Attorney, Agent, or Firm*—Fox Rothschild, LLP; Robert J. Sacco

(57) ABSTRACT

A decoding system (100) is provided. The decoding system is comprised of two or more serial concatenated convolutional code (SCCC) decoders ($102_1$-$102_N$) operating in parallel. The SCCC decoders are configured to concurrently decode code-blocks which have been encoded using a convolutational code. The decoding system is also comprised of a single common address generator (108) and data store (114). The address generator is responsive to requests for data needed by two or more of the SCCC decoders for permutation and depermutation. The data store is comprised of two or more memory blocks ($116_1$-$116_K$). The SCCC decoders concurrently generate requests for two or more different data types. Selected ones of the different data types are exclusively stored in different ones of the memory blocks. Selected ones of the different data types are comprised of data which is requested at the same time by a particular one of the SCCC decoders.

14 Claims, 2 Drawing Sheets

OTHER PUBLICATIONS

Benedetto, et al., "Serial Concatenation of Interleaved Codes: Performance Analysis, Design, and Iterative Decoding," IEEE Transactions on Information Theory, vol. 44, No. 3, May 1988, pp. 909-926.

Garello, et al., "Computing the Free Distance of Turbo Codes and Serially Concatenated Codes with Interleavers: Algorithms and Applications," IEEE Jnl on Selected Areas in Communications, vol. 19, No. 5, May 2001, pp. 800-812.

Bosco, et al., "A New Algorithm for 'Hard' Iterative Decoding of Concatenated Codes," IEEE Transactions on Communications, vol. 51, No. 8, Aug. 2003, pp. 1229-1232.

Benedetto, et al., "Serial Concatenation of Block and Convolutional Codes," Electronics Letters, May 9, 1996, vol. 32, No. 10, pp. 887-888.

Benedetto, et al., "Iterative decoding of serially concatenated convolutional codes," Electronics Letters, Jun. 20, 1996, vol. 32, No. 13, pp. 1186-1188.

Benedetto, et al., "Concatenated codes with interleaver for digital transmission over mobile channels," IEEE International Conference on Communications, 2001. ICC 2001, Jun. 11-14, 2001, pp. 3026-3030, vol. 10.

Scanavino, et al., "Convergance properties of iterative decoders working at bit and symbol level," Global Telecommunications Conference, 2001, IEEE vol. 2, Nov. 25-29, 2001, pp. 1037-1041.

Benedetto, et al., "On the Design of Binary Serially Concatenated Convolutional Codes," Communication Theory Mini-Conference, 1999, Jun. 6-10, 1999, pp. 32-36.

Benedetto , et al., "Serial Concatenated Trellis Coded Modulation with Iterative Decoding," Proceedings, 1997, IEEE International Symposium on Information Theory Jun. 29-Jul. 4, 1997, p. 8.

Benedetto, et al., "Serial concatenation of interleaved codes: performance analysis, design and iterative decoding," IEEE International Symposium on Information Theory, 1997 Proceedings. p. 106.

Benedetto, et al., "Serial concatenation of interleaved codes: analytical performance bounds," Global Telecommunications Conf., 1996. "Communications: The Key to Global Prosperity," vol. 1, Nov. 18-22, 1996, pp. 106-110.

Chandran, "MAP Algorithm FAQ," found on the WWW at <<http://www.ittc.ku.edu/~rvc/projects/faq/map.htm>> printed on Feb. 5, 2007.

* cited by examiner

US 7,870,458 B2

PARALLEL ARRANGEMENT OF SERIAL CONCATENATED CONVOLUTIONAL CODE DECODERS WITH OPTIMIZED ORGANIZATION OF DATA FOR EFFICIENT USE OF MEMORY RESOURCES

STATEMENT REGARDING FEDERALLY SPONSORED RESEARCH OR DEVELOPMENT

This invention was made with Government support under Contract No. FA8808-04-C-0022 awarded by the U.S. Air Force. The Government has certain rights in this invention.

BACKGROUND OF THE INVENTION

1. Statement of the Technical Field

The inventive arrangements relate to digital communication equipment using an error correction technique. More particularly, the inventive arrangements relate to a serial concatenated convolutional code decoder.

2. Description of the Related Art

A serially concatenated convolutional code (SCCC) decoder provides a means for recovering information bits from a codeword. A codeword is often comprised of a bitstream that has been encoded using a forward error correction (FEC) technique based on at least one convolutional code. A codeword may be a relatively large sequence of information bits (for example, a few thousand information bits) to provide a high recoverability of encoded information container therein.

It is known in the art that a plurality of SCCC decoders can be implemented in a parallel configuration on a field programmable gate array (FPGA) or an application specific integrated circuit (ASIC). Each of the SCCC decoders is coupled to a respective random access memory (RAM) data store via a system bus. Each RAM data store contains data needed by a respective SCCC decoder to sequentially write sets of serially linked information bits to a depermutation and/or a permutation buffer memory for storage. Each RAM data store also contains data needed by a respective SCCC decoder to non-sequentially read sets of serially linked information bits from the depermutation and/or permutation buffer memory.

Each SCCC decoder is comprised of an input buffer memory, a processing loop module, and an output buffer memory. The input buffer memory is comprised of hardware and firmware configured to receive encoded information bits from an external device and to temporarily store the same. The processing loop module is comprised of hardware and firmware configured to decode information bits using an iterative process (described in greater detail below). In this regard, it should be appreciated that the processing loop module is often comprised of an inner decoder module, a depermutation module, an outer decoder module, and a permutation module. The output buffer memory is comprised of hardware and firmware configured to receive decoded information bits from the processing loop module and to temporarily store the same.

With regard to the processing loop module, the burden of decoding information contained within a codeword is split between the inner decoder module and the outer decoder module. In this regard, it should be appreciated that the inner decoder module and the outer decoder module employ methods of maximum a posteriori (MAP) decoding or max-log approximations to MAP decoding. MAP decoding and max-log approximations to MAP decoding are well known to persons skilled in the art. Thus, such methods will not be described in great detail herein.

The inner decoder module is often comprised of hardware and firmware configured to obtain a sequence of information bits from the input buffer memory and/or the permutation module. Upon receipt of all or a portion of an information bit sequence, the inner decoder module begins processing the received information bits. This processing typically involves performing a relatively simple decoding operation based on a corresponding convolutional inner code. After processing the information bits, the inner decoder communicates the processed information bits to the depermutation module for depermutation (i.e., rearrangement or reorganization) and storage in a depermutation buffer memory. In this regard, it should be understood that the depermutation of processed information bits is accomplished by reading the stored information bits from the depermutation buffer memory in an order different from an order in which the information bits were written to the depermutation buffer memory for storage. It should also be understood that depermutation of information bits is necessary to reverse a permutation of information bits that occurred in an encoding process.

The outer decoder module is comprised of hardware and firmware configured to receive a sequence of depermuted information bits communicated from the depermutation module. Upon receipt of all or a portion of an information bit sequence, the outer decoder module begins processing the received information bits. This processing typically involves performing a relatively simple decoding operation based on a corresponding convolutional outer code. After processing the information bits, the outer decoder module communicates the processed information bits to the permutation module for permutation (i.e., rearrangement or reorganization) and storage in a permutation buffer memory. It should be understood that permutation is necessary to realign the information bits to the permutation that occurred in an encoding process. The permutation of processed information bits is accomplished by reading the stored information bits from the permutation buffer memory in an order different from an order in which the information bits were written to the permutation buffer memory for storage. Thereafter, a sequence of permuted information bits is communicated, along with the original codeword, to the inner decoder module.

The above described process is performed for 'M' iterations. After 'M' iterations, the outer decoder module produces decoded information bits. Subsequently, the outer decoder module forwards the decoded information bits to the output buffer memory for storage.

As will be appreciated by a person skilled in the art, FPGAs and ASICs have limited hardware resources. The above-described decoding system employing a number of parallel processing SCCC decoders and associated RAM data stores is hardware resource intensive. As such, it is desirable to have a decoding system with a more efficient use of FPGA and/or ASIC hardware resources.

SUMMARY OF THE INVENTION

The invention concerns a decoding system. The decoding system is comprised of two or more serial concatenated convolutional code (SCCC) decoders operating in parallel. The SCCC decoders are configured to concurrently decode codeblocks which have been encoded using a convolutional code. The decoding system is also comprised of a single common address generating means. The address generating means includes an address generator (e.g., a data processing means) and a data store. The address generator is responsive to requests for data needed by the SCCC decoders for permutation and depermutation. The address generator is coupled to the data store so that the address generator can access the data store and retrieve data stored therein.

According to an aspect of the invention, the SCCC decoders and the common address generating means are formed from a field programmable gate array (FPGA) or an application specific integrated circuit (ASIC). The data store is comprised of two or more memory blocks. The SCCC decoders concurrently generate requests for different data types. Selected ones of the different data types are exclusively stored in different ones of the memory blocks. Selected ones of the different data types are comprised of data which is commonly requested at approximately the same time by a particular one of the SCCC decoders.

According to another aspect of the invention, selected ones of the different data types include address data types. The address data types include even address data and odd address data. Selected ones of the different data types include permutation data types. The permutation data types include inverse permutation data used for depermutation and normal permutation data used for permutation. Selected ones of the different data types include compression data types. The compression data types includes high data compression data and low data compression data.

According to yet another aspect of the invention, the SCCC decoders are synchronized so as to begin an iteration of a decoding cycle at substantially the same time. The SCCC decoders are also synchronized so as to end an iteration of a decoding cycle at substantially the same time. The SCCC decoders are further synchronized so as to begin and end an iteration of a decoding cycle at substantially the same time.

The invention also concerns an address generator. The address generator is comprised of a data storage device and a data processor. The data processor is responsive to requests for data needed by two or more SCCC decoders for permutation and depermutation. The data storage device is comprised of two or more memory blocks. Each of the memory blocks has a predetermined size and a limited number of data access ports. The SCCC decoders concurrently generate requests for different data types. Selected ones of the different data types are exclusively stored in different ones of the memory blocks.

According to an aspect of the invention, selected ones of said different data types comprise data which is commonly requested at approximately the same time by one or more of the SCCC decoders. According to another aspect of the invention, selected ones of the different data types include address data types. The address data types include even address data and odd address data. Selected ones of the different data types include permutation data types. The permutation data types include inverse permutation data used for depermutation and normal permutation data used for permutation. Selected ones of the different data types include compression data types. The compression data types include high data compression data and low data compression data.

BRIEF DESCRIPTION OF THE DRAWINGS

Embodiments will be described with reference to the following drawing figures, in which like numerals represent like item throughout the figures, and in which.

DETAILED DESCRIPTION OF THE PREFERRED EMBODIMENTS

Figure 1:
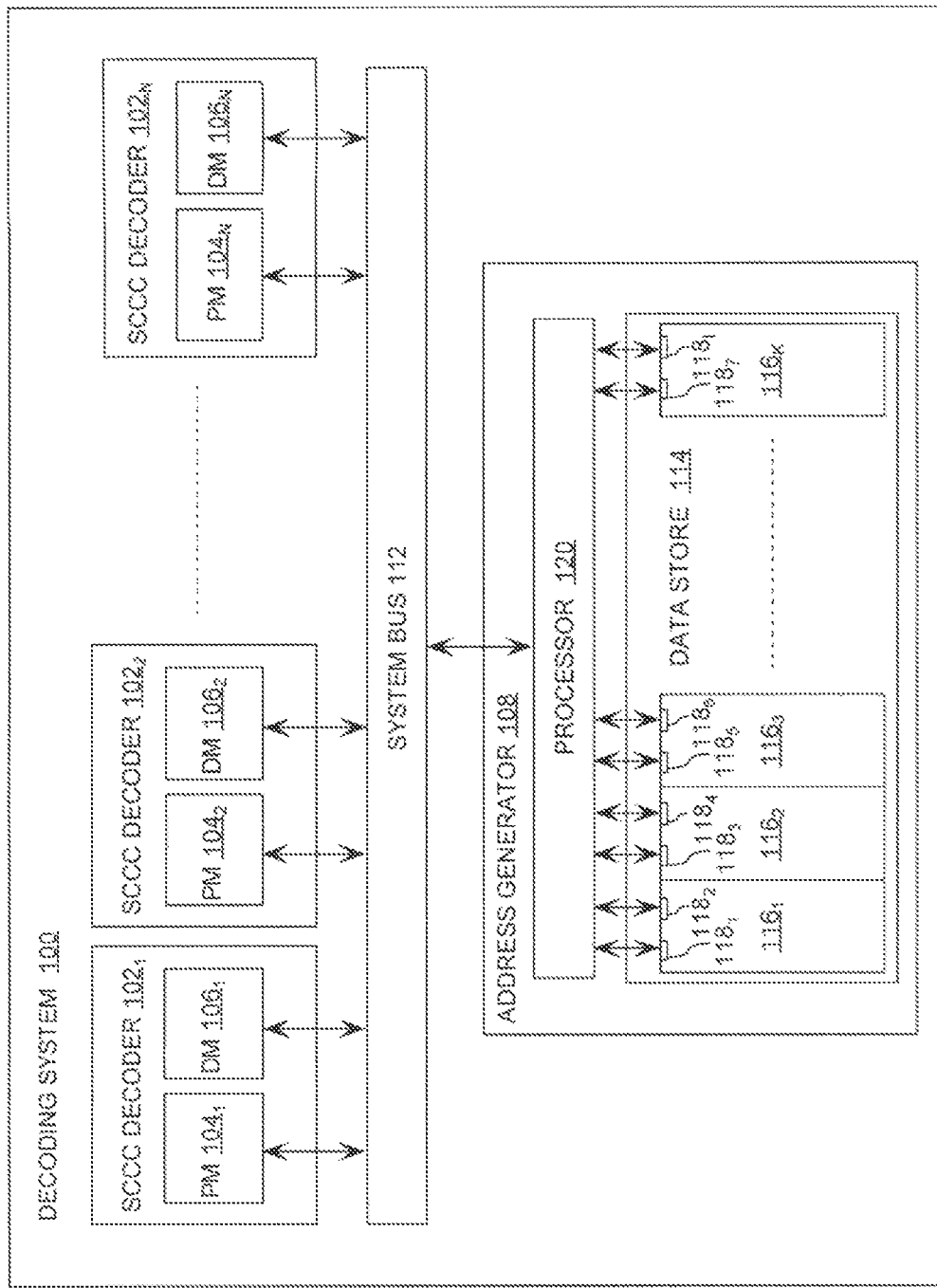
FIG. 1 is a block diagram of a decoding system that is useful for understanding the invention

Referring now to FIG. 1, there is provided a block diagram of a decoding system 100 that is useful for understanding the invention. The decoding system 100 is implemented on a programmable device, such as a field programmable gate array (FPGA) or an application specific integrated circuit (ASIC). According to an embodiment of the invention, the decoding system 100 is advantageously selected as an FPGA having a model number XC2V8000 which is available from Xilinx, Inc., of San Jose, Calif. Still, the invention is not limited in this regard. Any programmable device having a substantially fast parallel processing time feature can be used without limitation.

As shown in FIG. 1, the decoding system 100 is comprised of serial concatenated convolutional code (SCCC) decoders $102_1$-$102_N$ configured to concurrently process information bits encoded using a forward error correction (FEC) encoding technique based on a series of convolution codes, separated by a permutation step. As illustrated in FIG. 1, each of the SCCC decoders $102_1$-$102_N$ is comprised of a permutation module $104_1$-$104_N$ and a depermutation module $106_1$-$106_N$.

The decoding system 100 is also advantageously comprised of a single common address generator 108 connected to each of the SCCC decoders $102_1$-$102_N$ via a system bus 112. The address generator 108 is comprised of a data store 114 for storing several specific types of data according to a table format. This table is herein after referred to as a permutation table. The address generator 108 is also comprised of a processor 120. The processor 120 is configured to receive address requests from the SCCC decoders $102_1$-$102_N$. The processor is also configured to access the data store 114 and retrieve data from the same for generating sequentially or non-sequentially sequentially ordered memory space addresses. Still, the invention is not limited in this regard. For example, the decoding system 100 can alternatively be comprised of a single common address generator and a single common data store. In such a scenario, the address generator is coupled to the data store via the system bus 112. The address generator is configured to receive address requests from the SCCC decoders $102_1$-$102_N$. The address generator is also configured to access the data store and retrieve data from the same for generating sequentially or non-sequentially ordered memory space addresses.

The data store 114 is configured to allow stored data to be accessed by the processor 120 in any order. According to an embodiment of the invention, the data store 114 is a random access memory (RAM). Still, the invention is not limited in this regard. Conventional FPGA devices provide electronic available electronic memory in the form of a plurality of memory blocks. For example, the XC2V8000 from Xilinx offers numerous eighteen kilobit (18 kbit) blocks of memory. As shown in FIG. 1, the data store 114 is comprised of two or more such memory blocks $116_1$-$116_K$. Each memory block $116_1$-$116_K$ has a predetermined bit memory space. For example, each of the memory blocks $116_1$-$116_K$ has an eighteen kilobit (18 kbit) memory space. Still, the invention is not limited in this regard.

In a conventional FPGA, one or more access ports are generally provided for accessing data contained in each memory block $116_1$-$116_K$. For example, the XC2V8000 from Xilinx offers two data ports for each eighteen kilobit (18 kbit)

block of memory. Referring again to FIG. 1, each memory block $116_1$-$116_K$ is comprised of at least two access ports $118_1$-$118_I$ for accessing data stored therein.

The data stored in memory blocks $116_1$-$116_K$ is comprised of address data and compression data needed by each of the permutation modules $104_1$-$104_N$ for sequentially or non-sequentially writing groups of serially linked information bits to a permutation buffer memory (described below in relation to FIG. 2) for storage. Address and compression data are well known to persons skilled in the art, and therefore will not be described in great detail herein. However, it should be understood that compression data includes information necessary for reducing the number of bits contained in a group of serially linked information bits. In effect, a consumption of memory block $116_1$-$116_K$ resources is reduced.

The data stored in memory blocks $116_1$-$116_K$ is also comprised of normal permutation data needed by each of the permutation modules $104_1$-$104_N$ for reading groups of serially linked information bits from the permutation buffer memory in an order different from an order in which the groups of serially linked information bits were written to the permutation buffer memory for storage. Normal permutation data is well known to persons skilled in the art, and therefore will not be described in great detail herein. As such, each permutation module $104_1$-$104_N$ is operatively coupled to the memory blocks $116_1$-$116_K$ via the system bus 112 and processor 120.

Similarly, the data stored in the memory blocks $116_1$-$116_K$ is comprised of address data and compression data needed by each of the depermutation modules $106_1$-$106_N$ for sequentially or non-sequentially writing groups of serially linked information bits to a depermutation buffer memory (described below in relation to FIG. 2) for storage. The data stored in the memory blocks $116_1$-$116_K$ is also comprised of inverse permutation data needed by each of the depermutation modules $106_1$-$106_N$ for reading groups of serially linked information bits from the depermutation buffer memory in an order different from an order in which the groups of serially linked information bits were written to the depermutation buffer memory for storage. Inverse permutation data is well known to persons skilled in the art, and therefore will not be described in great detail herein. As such, each depermutation module $106_1$-$106_N$ is operatively coupled to the memory blocks $116_1$-$116_K$ via the system bus 112 and processor 120.

In a conventional type SCCC decoding system, a separate address generator 108 would typically be provided for each SCCC decoder $102_1$-$102_N$. In this regard, it should be understood that the data set required by each address generator 108 is generally the same. However, due to the concurrent operation of the SCCC decoders $102_1$-$102_N$, it has conventionally been understood that a single address generator 108 would not be capable of timely processing all of the concurrent or nearly concurrent requests for data received from the various SCCC decoders $102_1$-$102_N$. Stated differently, the number of concurrent or nearly concurrent requests for data directed to an address generator 108 from the SCCC decoders $102_1$-$102_N$ will generally tend to exceed the rate at which such data can be accessed and served by the available access ports $118_1$-$118_I$. Still, it will be appreciated that providing a separate address generator 108 for each SCCC decoder $102_1$-$102_N$ is generally wasteful of system resources since each data store 114 of the address generators 108 would contain generally the same data.

The foregoing data access problem could potentially be resolved with a memory access circuit that is a custom design, uniquely configured to accommodate the volume of data access requests involved. However, for relatively low production volume, it is often desirable to implement parallel arrangements of SCCC decoders using an FPGA instead of custom circuit design, such as an ASIC device. An FPGA offers several cost advantages as compared to an ASIC where relatively low production volume is involved. However, a disadvantages to using the FPGA is that the memory blocks $116_1$-$116_K$ are preconfigured such that the memory blocks generally have a predetermined size (e.g. eighteen (18) kilobits) and a predetermined number of data access ports (typically only two (2) ports). Thus, a designer using an FPGA must work within the confines of the available memory resources. The net result for the purposes of implementing a parallel SCCC decoder is that a separate address generator 108 and data store 114 is generally necessary for each SCCC decoder $102_1$-$102_N$.

In contrast, it should be noted that the present invention discloses a method and system that allows a single address generator 108 and data store 114 to service numerous SCCC decoders $102_1$-$102_N$ concurrently without any substantial reduction in processing efficiency. Prior to discussing these novel features, it is useful to understand the operation of SCCC decoders $102_1$-$102_N$ in greater detail.

Figure 2:
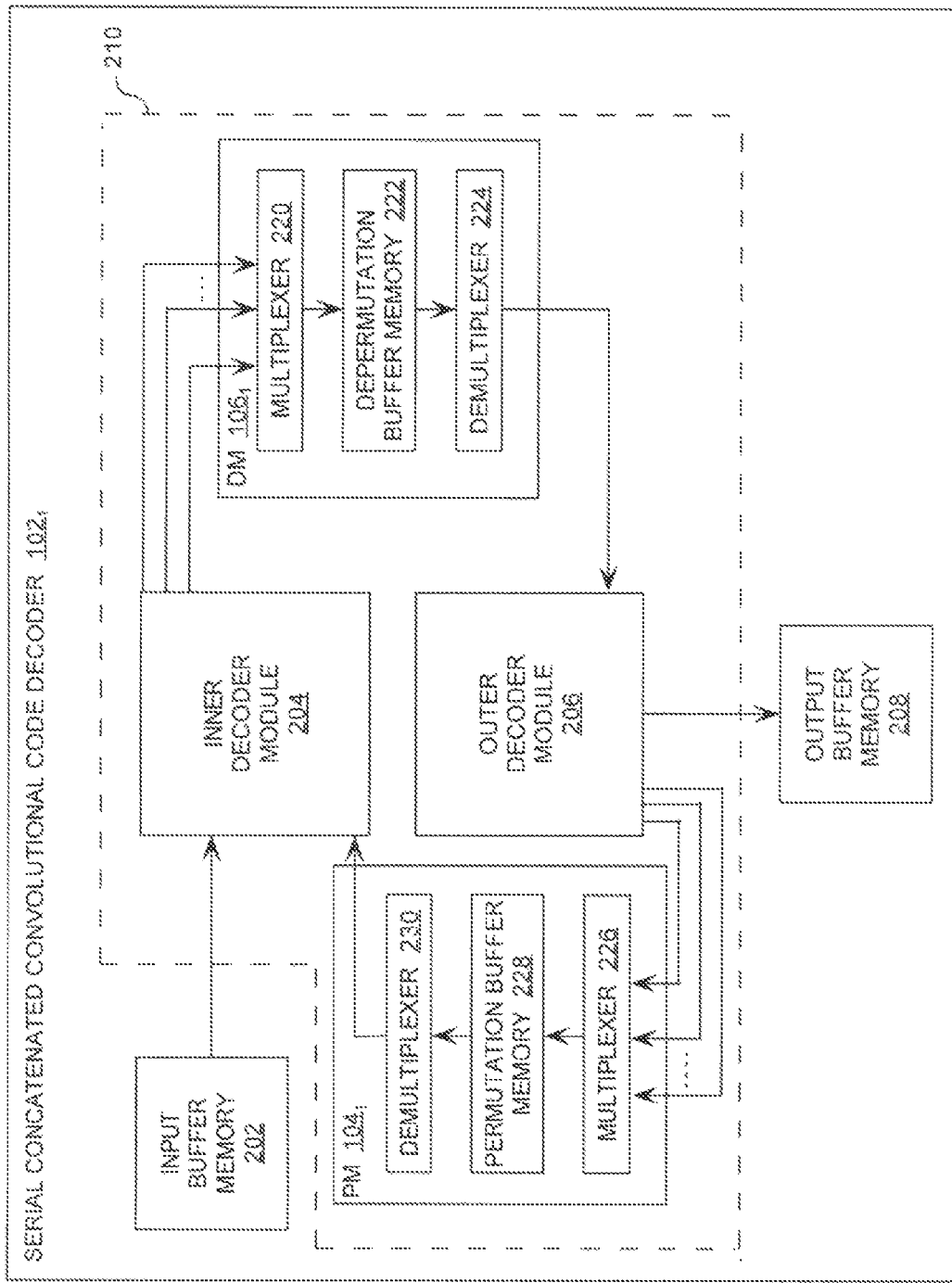
FIG. 2 is a block diagram of a serial concatenated convolutional code (SCCC) decoder shown in FIG. 1 that is useful for understanding the invention.

Referring now to FIG. 2, a block diagram of the SCCC decoder $102_1$ is provided that is useful for understanding the invention. Although only the SCCC decoder $102_1$ is shown in FIG. 2, it should be appreciated that the SCCC decoders $102_2$-$102_N$ have the same hardware architecture as that shown in FIG. 2. As such, the following discussion of the SCCC decoder $102_1$ is sufficient for understanding each of the SCCC decoders $102_2$-$102_N$ shown in FIG. 1.

As may be observed in FIG. 2, the SCCC decoder $102_1$ is comprised of an input buffer memory 202, a processing loop module 210, and an output buffer memory 208. The input buffer memory 202 provides a data store for encoded information bits $102_1$. In this regard, it should be appreciated that the input buffer memory 202 provides a means for storing information bits in a codeblock format. Codeblock formats are well known to persons skilled in the art. Thus, codeblock formats will not be described in great detail herein. Also, methods for storing information bits in a codeblock format are well known by persons skilled in the art. Any such method can be used without limitation.

As shown in FIG. 2, the input buffer memory 202 is coupled to the processing loop module 210. The processing loop module 210 is provided for decoding encoded information bits by performing 'M' iterations of a decoding cycle. The decoding cycle includes data processing performed by an inner decoder module 204, a depermutation module $106_1$, an outer decoder module 208, and a permutation module $104_1$.

In this regard, it should be appreciated that the decoding cycle begins when the inner decoder module 204 receives encoded information bits from the input buffer memory 202 and/or information bits from the permutation module $104_1$. Upon receipt of one or more information bits, the inner decoder module 204 performs data processing on the same. This data processing includes performing a decoding operation based on a decoding algorithm. The decoding algorithm can be selected as a maximum a posteriori (MAP) based decoding algorithm or a max-log approximation to MAP decoding. MAP decoding and max-log approximations to MAP decoding are well known to persons skilled in the are. Thus, such methods will not be described in great detail herein. However, it should be understood that this decoding operation is performed for processing information bits. In this regard, it should be appreciated that the inner decoder module 204 is configured to concurrently process 'N' information bits. After processing the 'N' information bits, the inner decoder module 204 communicates in parallel the 'N' information bits to the depermutation module $106_1$ for processing and storage.

As shown in FIG. 2, the depermutation module $106_1$ is comprised of a multiplexer 220, a depermutation buffer memory 222, and a demultiplexer 224. It should be understood that the address generator 108 (described above in relation to FIG. 1) is operatively coupled to the depermutation buffer memory 222 and the demultiplexer 224. It should also be understood that the depermutation module $106_1$ can further be comprised of a routing device (not shown) coupled to the demultiplexer 224 and the outer decoder module 206.

Upon receiving a set of 'N' information bits communicated in parallel from the inner decoder module 204, the multiplexer 220 serially links the 'N' information bits together to form a codeword segment. Thereafter, the multiplexer 220 writes the codeword segment to a depermutation buffer memory 222 space location having an address generated by the address generator 108 (described above in relation to FIG. 1). In this regard, it should be appreciated that the address generator 108 generates the address using address and compression data stored in the data store 114 (described above in relation to FIG. 1). It should also be appreciated that the multiplexer 220 repeats the above described process until all the information bits received from the inner decoder module 204 have been processed to form codeword segments and written to depermutation buffer memory 222 spaces according to a sequential addressing scheme or a non-sequential addressing scheme.

Subsequently, the demultiplexer 224 retrieves codeword segments from the depermutation buffer memory 222. In this regard, it should be understood that the demultiplexer 224 retrieves a single codeword segment per clock cycle. For example, the demultiplexer 224 retrieves a first code word segment during a first clock cycle. The demultiplexer 224 retrieves a second codeword segment during a second clock cycle, and so on. It should also be understood that codeword segments are retrieved from the depermutation buffer memory 222 in an order different from the order in which the codeword segments were written to the depermutation buffer memory 222 for storage. This order of reading codeword segments from the depermutation buffer memory 222 is defined by the address generator 108 using inverse permutation data stored in the data store 114 (described above in relation to FIG. 1). It should further be understood that each codeword segment is retrieved from the depermutation buffer memory 222 a plurality of times so that each information bit contained in the codeword segments is processed by the outer decoder module 206. For example, if a codeword segment includes 'N' information bits, then the codeword segment is retrieved from the depermutation buffer memory 222 'N' times.

Once the demultiplexer 224 receives a codeword segment, the demultiplexer 224 performs processing on the codeword segment to extract an information bit therefrom. After processing a received codeword segment, the demultiplexer 224 forwards the extracted information bit to a router (not shown) or the outer decoder module 206. Upon receipt of one or more information bits, the outer decoder module 206 begins performing a decoding operation based on a decoding algorithm. For example, a MAP type decoding algorithm can be used for this purpose. This decoding operation is performed for processing an information bit. In this regard, it should be appreciated that the outer decoder module 206 is configured to concurrently process 'N' information bits. After processing the 'N' information bits, the outer decoder module 206 communicates, in parallel, the 'N' processed information bits to the permutation module $104_1$.

The permutation module $104_1$ is comprised of a multiplexer 226, a permutation buffer memory 228, and a demultiplexer 230. It should be understood that the address generator 108 (described above in relation to FIG. 1) is operatively coupled to the permutation buffer memory 228 and the demultiplexer 230. It should also be understood that the permutation module $104_1$ can further be comprised of a routing device (not shown) coupled to the demultiplexer 230 and the inner decoder module 204.

Upon receiving a set of 'N' information bits communicated in parallel from the outer decoder module 206, the multiplexer 226 serially links the 'N' information bits together to form a codeword segment. Thereafter, the multiplexer 226 writes the codeword segment to the permutation buffer memory 228 space location having an address generated by the address generator 108 (described above in relation to FIG. 1). In this regard, it should be appreciated that the address generator 108 generates the address using address and compression data stored in the data store 114 (described above in relation to FIG. 1). It should also be appreciated that the multiplexer 226 repeats the above described process until all the information bits received from the outer decoder module 206 have been processed to form codeword segments and written to permutation buffer memory 228 spaces according to a sequential addressing scheme or a non-sequential addressing scheme.

Subsequently, the demultiplexer 230 retrieves codeword segments from the permutation buffer memory 228. In this regard, it should be understood that the demultiplexer 230 retrieves a single codeword segment per clock cycle. For example, the demultiplexer 230 retrieves a first codeword segment during a first clock cycle. The demultiplexer 230 retrieves a second codeword segment during a second clock cycle, and so on. It should also be understood that the codeword segments are retrieved from the permutation buffer memory 228 in an order different from the order in which the codeword segments were written to the permutation buffer memory 228 for storage. This order of reading codeword segments from the permutation buffer memory 228 is defined by the address generator 108 using permutation data stored in the data store 114 (described above in relation to FIG. 1). It should further be understood that each codeword segment is retrieved from the permutation buffer memory 228 a plurality of times so that each information bit contained in the codeword segments is processed by the inner decoder module 204. For example, if a codeword segment includes 'N' information bits, then the codeword segment is retrieved from the permutation buffer memory 228 'N' times.

Once the demultiplexer 230 receives a codeword segment, the demultiplexer 230 performs processing on the codeword segment to extract an information bit therefrom. After processing a received codeword segment, the demultiplexer 230 forwards the extracted information bit to the inner decoded module 204 thereby starting another iteration of the decoding cycle. In this regard, it should be appreciated that the inner decoder module 204 sequentially receives information bits from the permutation module $104_1$, i.e., a single information bit is forwarded to the inner decoder module 204 per clock cycle. For example, a third information bit of a first codeword segment is forwarded to the inner decoder module 202 during a first clock cycle. Similarly, an eighth information bit of a second codeword segment is forwarded to the inner decoder module 202 during a second clock cycle, and so on.

As mentioned above, the decoding cycle is performed for 'M' iterations. After 'M' iterations, the outer decoder module 206 produces decoded information bits. Subsequently, the outer decoder module 206 forwards the decoded information bits to the output buffer memory 208 for storage.

Referring again to FIG. 1, the present invention discloses a method and system that allows a single address generator 108 and data store 114 to service a plurality of SCCC decoders 102$_1$-102$_N$ concurrently and without any substantial reduction in processing efficiency. This improvement is achieved by selectively arranging the data stored in memory blocks 116$_1$-116$_K$ to substantially reduce the likelihood that any single memory block will be unable to process all of the data requests that are directed to that memory block 116$_1$-116$_K$ at any given moment in time.

It has been determined that certain types of data are often requested simultaneously (or nearly simultaneously) by the SCCC decoders 102$_1$-102$_N$. If these simultaneous requests both concern data that is contained in one memory block 116$_1$-116$_K$, then such simultaneous requests can exhaust the number of available access ports for that memory block. If a third data request is initiated by one of the SCCC decoders 102$_1$-102$_N$, the memory block will be busy and will not be able to respond.

To avoid the foregoing problem, certain types of data that are likely to be requested concurrently (or nearly concurrently) by SCCC decoders 102$_1$-102$_N$ are advantageously stored in separate memory blocks 116$_1$-116$_K$. In this way, the chances are reduced substantially that the available access ports 118$_1$-118$_J$ will both be in use at the same time. According to an embodiment of the invention, address data, permutation data, and compression data is advantageously divided into data types, arranged into groups, and stored in memory blocks 116$_1$-116$_K$ to maximize access.

The data commonly utilized by SCCC decoders 102$_1$-102$_N$ includes at least three basic types, which include address data, permutation data, and compression data. Each of these can be further sub-divided into data types as set forth on the list below:
  address data types include: even address data/odd address data;
  permutation data types include: inverse permutation data (used for depermutation)/normal permutation data (used for permutation); and
  compression data types include: high data compression data/low data compression data.

In the context of this embodiment of the SCCC decoders, it has been determined that even address data and odd address data are always requested at the same time by a particular SCCC decoder 102$_1$-102$_N$. It has also been determined that inverse permutation data type and normal permutation data type will always be requested at the same time by a particular SCCC decoder 102$_1$-102$_N$. Finally, it has been determined that high data compression type and low data compression type will never be requested at the same time.

Using the foregoing information, it is possible to devise an arrangement of data among the separate memory blocks 116$_1$-116$_K$ to ensure multiple permutation modules 104$_1$-104$_N$ and depermutation modules 106$_1$-106$_N$ receive the needed data. Having a single address generator 108 for the arrangement data prevents multiple different data requests to the same memory block 116$_1$-116$_K$ for data stored therein. For example, even address data and odd address data are always requested at exactly the same time. Accordingly, it is advantageous to avoid storing such data in the same memory block 116$_1$-116$_K$. Instead, these two different types of data are preferably stored in separate ones of memory blocks 116$_1$-116$_K$. Similarly, inverse permutation data and normal permutation data will always be requested at approximately the same time by a particular SCCC decoder 102$_1$-102$_N$. Accordingly, it is advantageous to store data of these two types apart from each other in separate memory blocks 116$_1$-116$_K$. Finally, since high data compression data and low data compression data will never be requested at the same time, it is also advantageous to purposely store such data in the same memory block 116$_1$-116$_K$.

It will be appreciated that the foregoing list represents three (3) basic types of data, with each type having two (2) variations. Thus, it can be understood that the foregoing list of data represents two to the power of three ($2^3$) or eight (8) types of data. Each of these eight (8) types of data is advantageously stored in separate memory blocks 116$_1$-116$_K$ to ensure that the processor 120 (described above in relation to FIG. 1) never needs to simultaneously communicate multiple data requests to the same memory block 116$_1$-116$_K$ for data stored therein. According to an embodiment of the invention, two (2) memory blocks are required for storing each type of data. As such, a total of sixteen (16) memory blocks 116$_1$-116$_K$ is required in total for the data store 114. Still, the invention is not limited in this regard.

For example, and without limitation, even address data, inverse permutation data, high data compression data, and low compression data can be selected as a first group and stored in the memory blocks 116$_1$ through 116$_4$. Similarly, even address data, normal permutation data, high data compression data, and low data compression data is selected as a second group and stored in the memory blocks 116$_5$ through 116$_8$. Likewise, odd address data, inverse permutation data, high data compression data, and low data compression data is selected as a third group and stored in the memory blocks 116$_9$ through 116$_{12}$. Odd address data, normal permutation data, high data compression data, and low data compression data is selected as a fourth group and stored in the memory blocks 116$_{13}$ through 116$_{16}$. Still, the invention is not limited in this regard.

Another aspect of the present invention concerns the algorithms that are utilized in each of the SCCC decoders 102$_1$-102$_N$. In conventional SCCC decoder systems that use a plurality of individual SCCC decoders arranged in parallel, each of the individual SCCC decoders operates asynchronously. Stated differently, this can be understood to mean that each SCCC decoder will begin and end each processing cycle at different times. In conventional systems where the SCCC decoders 102$_1$-102$_N$ each have their own dedicated address generator and data store, such asynchronous operation has little or no affect on memory resources. However, the present invention relies upon a selective arrangement of data in the memory blocks 116$_1$-116$_K$ which is intended to reduce the likelihood that any one memory block will be unable to process the number of memory requests directed to it. The advantages of this arrangement can be diminished where each of the SCCC decoders 102$_1$-102$_N$ operates asynchronously. Asynchronous operation of the SCCC decoders 102$_1$-102$_N$ can randomize the timing of the data requested by each of the SCCC decoders 102$_1$-102$_N$. With such random data request timing, it is not possible to predict (or control) the number of requests for data that a particular one of the memory blocks 116$_1$-116$_K$ will receive at any given moment. This can again lead to an excessive number of data requests being directed to a particular memory block 116$_1$-116$_K$ and resulting delays in accessing the data stored in the data store 114.

In order to avoid the foregoing problem, the algorithms used in each of the SCCC decoders 102$_1$-102$_N$ can be modified so that each SCCC decoders 102$_1$-102$_N$ begins and ends a decoding cycle at substantially the same time. In this regard, the SCCC decoders $102_1$-$102_N$ can be said to be synchronized. As mentioned above, the decoding cycle is performed for 'M' iterations. In this regard, it should be understood that as used herein, the term "synchronized" does not necessarily means that each of the SCCC decoders $102_1$-$102_N$ is concurrently executing the same iteration concurrently. A first SCCC decoders $102_1$ could be beginning iteration number m while an SCCC decoders $102_N$ might be just beginning an iteration number m plus three (m+3). The algorithms used in each of the SCCC decoders $102_1$-$102_N$ is simply modified so that each of the SCCC decoders $102_1$-$102_N$ will consistently begin and end a decoding cycle at substantially the same time. This synchronization provides a degree of predictability to the types of data requests that will be received by data store 114 at any given time during the decoding process.

As should be understood by a person skilled in the art, multiple iterations of decoding process are substantially similar. For instance, a first iteration of the decoding process has to ingest codewords. A last iteration of the decoding process has to outgest codewords. Various intermediate iterations have other control and status chores to perform. Accordingly, one modification to the algorithms used in each of the SCCC decoders $102_1$-$102_N$ can include adjusting iteration steps such that all of the SCCC decoders $102_1$-$102_N$ need data from the data store 114 at the exact same time. Depending on the situation, this can be done by swapping an order of controls, changing an order of tasks to be performed by the SCCC decoders $102_1$-$102_N$, and/or delaying tasks to be performed by the SCCC decoders $102_1$-$102_N$.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

We claim:

1. A decoding system, comprising:
a plurality of serial concatenated convolutional code (SCCC) decoders arranged in parallel and configured for concurrently decoding a codeblock which has been encoded using a convolutional code; and
a single common address generating means including an address generator and a data store comprising a plurality of memory blocks,
said address generator operatively coupled to said plurality of SCCC decoders and responsive to requests for memory addresses of a plurality of data segments needed by said plurality of SCCC decoders for permutation and depermutation, said address generator operatively coupled to said data store and configured to retrieve data stored in said plurality of memory blocks of said data store, said data including information needed by said address generator in order to generate said memory addresses;
wherein said data comprises groups of data types, selected ones of said groups of data types stored in separate ones of said plurality of memory blocks based on a predetermined likelihood that data from particular groups will be concurrently needed by said address generator.

2. The decoding system according to claim 1, wherein said plurality of SCCC decoders and said single common address generating means are formed from an FPGA or an ASIC.

3. The decoding system according to claim 1, wherein said data types include address data types comprising even address data and odd address data.

4. The decoding system according to claim 1, wherein said data types include permutation data types comprising inverse permutation data used for depermutation and normal permutation data used for permutation.

5. The decoding system according to claim 1, wherein said data types include compression data types comprising high data compression data and low data compression data.

6. The decoding system according to claim 1, wherein said plurality of SCCC decoders are synchronized so as to begin an iteration of a decoding cycle at substantially the same time.

7. The decoding system according to claim 1, wherein said plurality of SCCC decoders are synchronized so as to end an iteration of a decoding cycle at substantially the same time.

8. An address generator comprising:
a data storage device comprised of a plurality of memory blocks each of a predetermined size and having a limited number of data ports; and
a data processor coupled to said data storage device and configured to retrieve data stored in said plurality of memory blocks in response to requests for memory addresses for a plurality of data segments needed by a plurality of SCCC decoders for permutation and depermutation, said data including information needed by said address generator in order to generate said memory addresses;
wherein said data comprises groups of data types, and selected ones of said data types being exclusively stored in different ones of said plurality of memory blocks based on a predetermined likelihood that data from particular groups will be needed concurrently by said address generator.

9. The data store according to claim 8, wherein said data types include address data types comprising even address data and odd address data.

10. The data store according to claim 8, wherein said data types include permutation data types comprising inverse permutation data used for depermutation and normal permutation data used for permutation.

11. The data store according to claim 8, wherein said data types include compression data types comprising high data compression and low data compression.

12. A decoding system, comprising:
a plurality of serial concatenated convolutional code (SCCC) decoders arranged in parallel and configured for concurrently performing operations to decode a codeblock which has been encoded using a convolutional code, said operations comprising serially arranging information bits of said codeblock to form a plurality of data segments and storing said plurality of data segments in at least one memory device; and
a single common address generating device including a data processor and a data store comprising a plurality of memory blocks,
said data processor operatively coupled to said plurality of SCCC decoders and responsive to requests for memory addresses for said plurality of data segments needed by said plurality of SCCC decoders for permutation and depermutation, said data processor operatively coupled to said data store and configured to retrieve data stored in said plurality of memory blocks of said data store, said data including information needed by said data processor in order to generate said memory addresses;

wherein said plurality of SCCC decoders and said single common address generating device are formed from an FPGA or on ASIC, and wherein said data comprises groups of data types, selected ones of said groups of data types stored in separate ones of said plurality of memory blocks based on a predetermined likelihood that data from particular groups will be needed concurrently by said address generator.

13. The decoding system according to claim 12, wherein said data types include address data types comprising even address data and odd address data, permutation data types comprising inverse permutation data used for depermutation and normal permutation data used for permutation, and compression data types comprising high data compression data and low data compression data.

14. The decoding system according to claim 12, wherein said plurality of SCCC decoders are synchronized so as to begin an iteration of a decoding cycle at substantially the same time.

* * * * *